(12) United States Patent
Rossi et al.

(10) Patent No.: US 7,489,883 B2
(45) Date of Patent: Feb. 10, 2009

(54) METHOD FOR DETERMINING TEMPERATURE OF AN ACTIVE PIXEL IMAGER AND AUTOMATIC CORRECTING TEMPERATURE INDUCED VARIATIONS IN AN IMAGER

(75) Inventors: Giuseppe Rossi, Pasadena, CA (US); Gennadiy A. Agranov, Sunland, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 705 days.

(21) Appl. No.: 10/798,347

(22) Filed: Mar. 12, 2004

(65) Prior Publication Data

US 2004/0170215 A1    Sep. 2, 2004

Related U.S. Application Data

(62) Division of application No. 10/290,397, filed on Nov. 8, 2002, now Pat. No. 6,974,973.

(51) Int. Cl.
*G03G 15/00* (2006.01)
*H04N 9/64* (2006.01)

(52) U.S. Cl. .................... 399/44; 348/243; 348/246

(58) Field of Classification Search ............. 324/721, 324/601, 71.1; 399/44; 348/243, 246
See application file for complete search history.

(56) References Cited

U.S. PATENT DOCUMENTS

| | | | |
|---|---|---|---|
| 4,162,411 A * | 7/1979 | Sakaue et al. | .................. 377/75 |
| 4,739,495 A | 4/1988 | Levine | |
| 4,744,672 A * | 5/1988 | Tursky et al. | ............... 374/178 |
| 4,862,237 A | 8/1989 | Morozumi | |
| 5,008,739 A | 4/1991 | D'Luna et al. | |
| 5,047,863 A | 9/1991 | Pape et al. | |
| 5,452,001 A | 9/1995 | Hosier et al. | |
| 5,625,413 A * | 4/1997 | Katoh et al. | ................. 348/246 |
| 5,886,353 A | 3/1999 | Spivey et al. | |
| 5,929,689 A | 7/1999 | Wall | |
| 5,953,060 A | 9/1999 | Dierickx | |
| 6,101,287 A | 8/2000 | Corum et al. | |
| 6,144,408 A | 11/2000 | MacLean | |
| 6,271,880 B1 * | 8/2001 | Kameshima et al. | ......... 348/244 |
| 6,303,923 B1 | 10/2001 | Wadsworth et al. | |
| 6,330,345 B1 | 12/2001 | Russo et al. | |
| 6,418,241 B1 | 7/2002 | Schreiner | |

(Continued)

FOREIGN PATENT DOCUMENTS

JP    02022873 A * 1/1990

OTHER PUBLICATIONS

AN03: Guide to Image Quality and Pixel Correction Methods, RadIcon Imaging Corp.

(Continued)

*Primary Examiner*—Vincent Q Nguyen
(74) *Attorney, Agent, or Firm*—Dickstein Shapiro LLP.

(57) ABSTRACT

An imager temperature sensor and a current correction apparatus are provided which use dark pixel measurements from an imager chip during operation together with a fabrication process constant as well as a chip dependent constant to calculate chip temperature. The chip temperature may be used to generate a current correction signal. The correction signal is used to tune a current on the imager chip to correct for temperature variations.

22 Claims, 9 Drawing Sheets

U.S. PATENT DOCUMENTS

| | | | | |
|---|---|---|---|---|
| 6,607,301 | B1* | 8/2003 | Glukhovsky et al. | 374/175 |
| 2003/0071196 | A1* | 4/2003 | Seitz | 250/214.1 |
| 2003/0202111 | A1 | 10/2003 | Park | |
| 2004/0032627 | A1* | 2/2004 | Tsai | 358/514 |
| 2004/0251915 | A1* | 12/2004 | Hagerling et al. | 324/614 |

OTHER PUBLICATIONS

Anton Bakker and John H. Huijsing; Micropower CMOS Temperature Sensor with Digital Output, IEEE Journal of Solid-State Circuits, vol. 31, No. 7, Jul. 1996, pp. 933-937.

Karim Arabi and Bozena Kaminska, Built-In Temperature Sensors for On-line Thermal Monitoring of Microelectronic Structures, Proceedings of the 1997 International Conference on Computer Design (ICCD '97), pp. 462-467.

Louis Luh, John Choma, Jr., Jeffrey Draper, Herming Chiueh, A High-Speed CMOS On-Chip Temperature Sensor, Proceedings of the European Solid State Circuits Conference, Sep. 1999, pp. 290-293.

V. Szekely, M. Rencz and B. Courtois, Integrating On-chip Temperature Sensors into DfT Schemes and BIST Architectures, Proceedings of the 15th IEEE VLSI Test Symposium, IEEE, (1997), pp. 440-445.

M. Loose, K. Meier, J. Schemmel, Self-calibrating logarithmic CMOS image sensor with single chip camera functionality, Contribution to IEEE CCD & AIS workshop, Karuizawa, Japan (1999) R27.

Hon-Sum Wong, Technology and Device Scaling Considerations for CMOS Imagers, IEEE Transactions on Electron Devices, vol. 43, No. 12, Dec. 1996, pp. 2131-2142.

Eric R. Fossum, Digital Camera System on a Chip, IEEE Micro, May-Jun. 1998, pp. 8-15.

C. C. Lui and C. H. Mastrangelo, CMOS Uncooled Heat-Balancing Infrared Imager, IEEE Journal of Solid-State Circuits, Apr. 2000, pp. 1-9.

* cited by examiner

METHOD FOR DETERMINING TEMPERATURE OF AN ACTIVE PIXEL IMAGER AND AUTOMATIC CORRECTING TEMPERATURE INDUCED VARIATIONS IN AN IMAGER

This application is a divisional application of U.S. patent application Ser. No. 10/290,397, filed on Nov. 8, 2002, now U.S. Pat. No. 6,974,973, issued on Dec. 13, 2005, the entirety of which is incorporated herein by reference.

FIELD OF THE INVENTION

The present invention relates generally to improved semiconductor imaging devices, and in particular to an imaging device employing temperature compensation.

BACKGROUND OF THE INVENTION

Imaging sensors are used to capture visible light or other types of incident radiation emissions and produce an image in a variety of applications. Many parameters of an imaging sensor are temperature dependent. It is therefore desirable to be able to determine image sensor temperature and use the temperature data in a variety of ways including compensation for the effects of temperature.

For example, in CMOS active pixel sensors (APS), overall analog power consumption is primarily the sum of the bias currents of each of the individual analog circuits. These bias currents are proportional to the master current $I_{ref}$ generated by a dedicated analog cell commonly referred to as the master current reference. In many cases, the master current reference cell has a positive thermal coefficient (PFAT) proportional to changes in absolute temperature, that is, as temperature increases, the master current increases, leading to a higher power consumption. On the other hand, as the temperature decreases, the reference current decreases leading to a reduction of the bias current for the analog circuits. With respect to its room temperature nominal value and within the temperature range of −20° C. to +65° C., it has been observed that the master current linearly varies from −15% to +15% from a nominal value. Furthermore, at room temperature the distribution of master current values in a population of CMOS chips is gaussian shaped with a standard deviation (sigma) of ~7% of the mean value. Chip-to-chip variations in master current values originate from manufacturing process variations and can typically only be corrected by individual trimming of the master current reference cell output. When process and temperature variations are combined together, temperature drift or changes cause variations of the master current $I_{ref}$ causing erroneous operation or possibly chip failure if the chip temperature changes too much.

Contemporary CMOS imager chips lack an optimal system for automatically compensating for variations in temperature in large measure because sensing of imager temperature requires dedicated circuitry which adds to design cost. Thus, a new approach is needed to provide a simplified temperature sensing system for CMOS imaging operations.

BRIEF SUMMARY OF THE INVENTION

In one aspect, the invention provides a temperature sensor, a current correction apparatus and operating method which uses dark pixel measurements from a chip during operation in combination with a known fabrication process constant and a chip dependent constant to more accurately calculate chip temperature. The chip temperature can be used to generate a temperature corrected current signal.

In another aspect of the invention, an imager chip is tested during manufacturing to determine chip dependent constants and one or more values representing a dark current scalar which are stored in an imager chip memory. The imager chip includes a pixel array with one or more dark current pixels for providing dark current signals. A logic circuit is configured to calculate a sensor temperature value based on the one or more dark current signals, the stored constants and calculated or stored scalar values. The temperature value can be used to adjust a master current source and/or individual circuit current sources on the imager chip to correct current supply for temperature variations.

The above and other features and advantages of the invention will be more readily understood from the following detailed description which is provided in connection with the accompanying drawings.

DETAILED DESCRIPTION OF THE INVENTION

The inventors have observed that a CMOS imager pixel dark current doubles every N° C. with N being a value which is process dependent and which in general ranges from 6 to 10. Dark current is that current which, under specified biasing conditions, flows in a photoconductive pixel when there is no incident radiation. Consequently, even in the absence of visible light or incident radiation dark current is present. Background radiation and thermal effects constitutes the dark current.

A variety of technical problems arise with making estimations of temperature from dark current and using such measurements for performing automatic current corrections. One difficulty is obtaining an accurate dark current measurement. Another problem is temperature calibration of the measured value of the dark current. While dark current measured from a pixel varies with temperature, there is not a direct proportional relationship between temperature and dark current. Several additional factors influence the relationship of dark current to temperature. For example, dark current relationships to temperature vary by manufacturing process. Also, the effects of temperature on dark current vary chip-to-chip.

The following equation illustrates various factors which have been found to affect a pixel dark current relationship to sensor temperature:

$$I_{dark} = I_0 e^{\alpha T} \quad (1)$$

where $I_{dark}$ is the dark current of the sensor represented by a dark current of a pixel at a temperature T, $I_0$ is a scaling factor for the dark current and $\alpha$ is a manufacturing process constant. Both constants ($I_0$ and $\alpha$) are independent of the sensor temperature T. An imager sensor temperature T can thus be derived from equation 1 as follows $$T = \frac{1}{\alpha} \ln \frac{I_{dark}}{I_0} \quad (2)$$

The constant a has a value which is dependent on the particular manufacturing process used to fabricate an image sensor. Experimentally, it has been found that the value of a does not significantly change from one pixel design to another pixel design, nor does it vary from chip to chip (or from wafer to wafer) but it is a process dependent constant.

Figure 1:
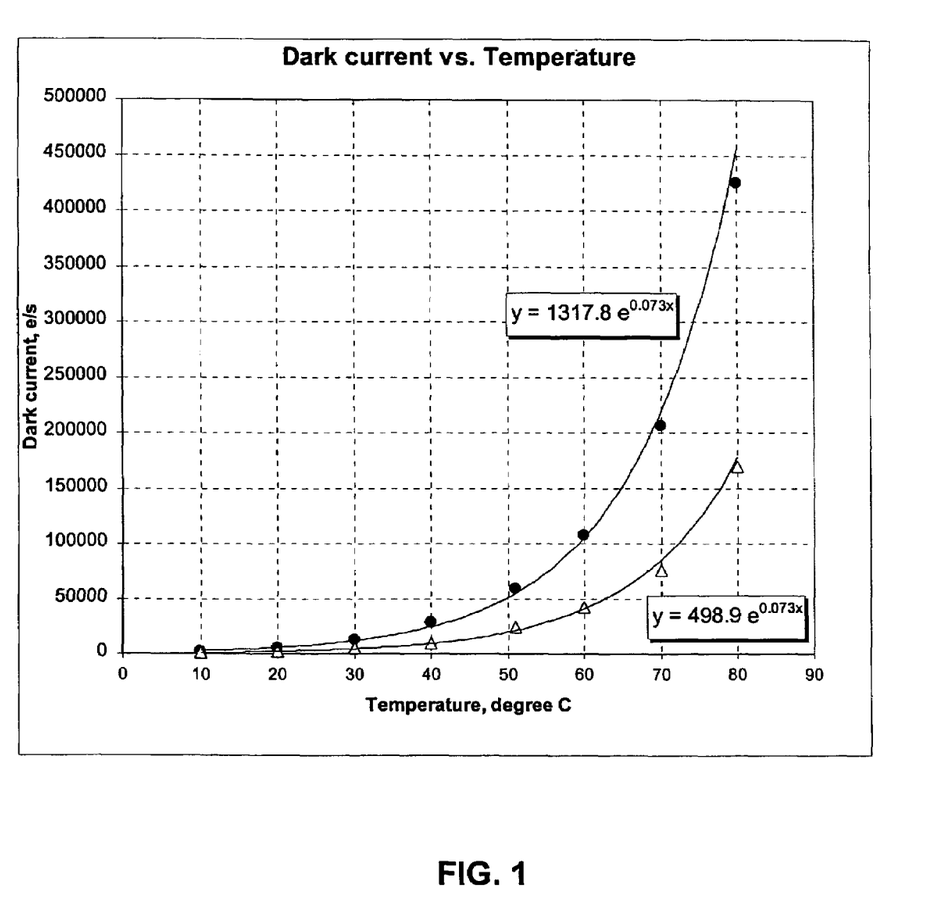
FIG. 1 shows a graph of an exponential relationship between dark current and sensor temperature.

FIG. 1 shows measured exponential relationships which exist between a pixel dark current and an image sensor temperature. The dark current versus temperature is shown as an exponential relationship with two unknowns which affect the relationship. One unknown is $\alpha$ and the second is the dark current scalar $I_0$ value shown in equation 1. These unknowns can be determined empirically by placing a variety of test image sensor chips made from the same manufacturing process in test equipment and then varying the ambient temperature of the sensor, and measuring a reference dark current for each reference temperature. The results can be logarithmically plotted as dark current versus temperature as shown in FIG. 2.

Figure 2:
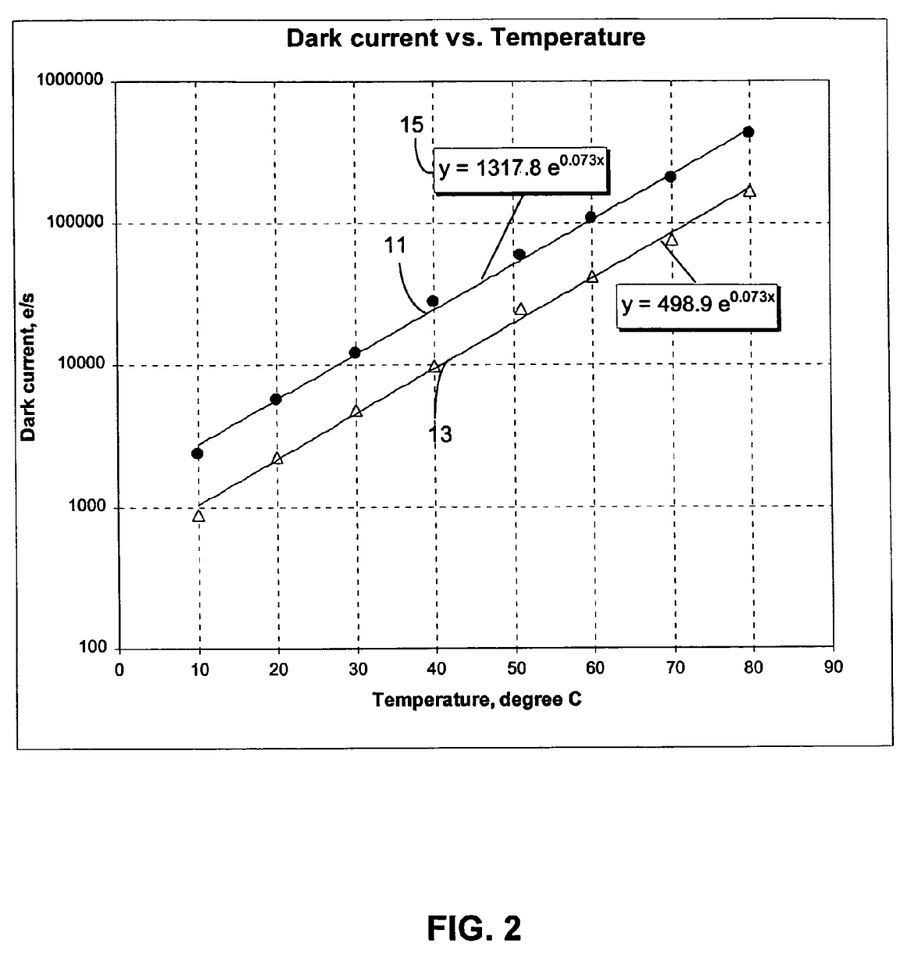
FIG. 2 shows a graph of a logarithmic relationship between dark current and sensor temperature.

The FIG. 2 logarithmic relationship between dark current and temperature is useful in determining process constant $\alpha$. FIG. 2 shows that two logarithmic plot lines 11, 13 for two different chip (pixel) designs produced by the same process have the same slope in the logarithmic representation. For the example shown in FIG. 2, the $\alpha$ constant is 0.073 for the two pixel designs. Thus, one way to determine $\alpha$ is to use the slope of a logarithmic equation describing dark current measurements at specific sensor temperatures for chips produced by the same process. A number of pixel designs can be tested to determine $\alpha$.

Equation 1 can be further explained in the context of the FIG. 2 exemplary logarithmic graph. Plot line 11 for one pixel design shows a "y" value 15 which corresponds to dark current $I_{dark}$, the plot line 11 value 1317.8 corresponds to a dark current $I_0$ scalar, the manufacturing exponential constant $\alpha$ is shown as 0.0073 and the "x" value corresponds to sensor temperature T.

Once the $\alpha$ constant is known from the slope of the FIG. 2 plot, the scalar $I_0$ can be determined. The scalar $I_0$ varies from chip-to-chip but can be determined from dark current reference values $I_{dark,ref}$ taken at a respective reference temperature $T_{ref}$ using the equation:

$$I_0 = \frac{I_{dark,ref}}{e^{\alpha T_{ref}}} \quad (3)$$

where $I_{dark,ref}$ is the measured value of dark current taken at reference temperature $T_{ref}$.

Once the values of $\alpha$ and $I_0$ are known for a particular chip, they may be stored on the chip in a memory as either the values $\alpha$ and $I_0$ or the values $\alpha$, $I_{dark,ref}$, $T_{ref}$. In the latter case, $I_0$ is calculated when needed from the stored $I_{dark,ref}$ and $T_{ref}$ values using equation (3) or these values can be directly used to calculate temperature. If the values $\alpha$ and $I_0$ are stored or the value $T_{ref}$ is calculated using equation 3, a sensor temperature T can be calculated from these values and a pixel dark current measurement $I_{dark}$ using equation (2). Alternatively, sensor temperature can be calculated from the stored values $\alpha$, $I_{dark,ref}$, $T_{ref}$ and a pixel dark current measurement $I_{dark}$ from the following equation:

$$T = \frac{1}{\alpha} \ln \frac{I_{dark}}{I_{dark,ref}} + T_{ref} \quad (4)$$

In either case, a reliable measurement of sensor temperature can be produced from a pixel dark current measurement taken from a dark pixel of the sensor.

Figure 3A:
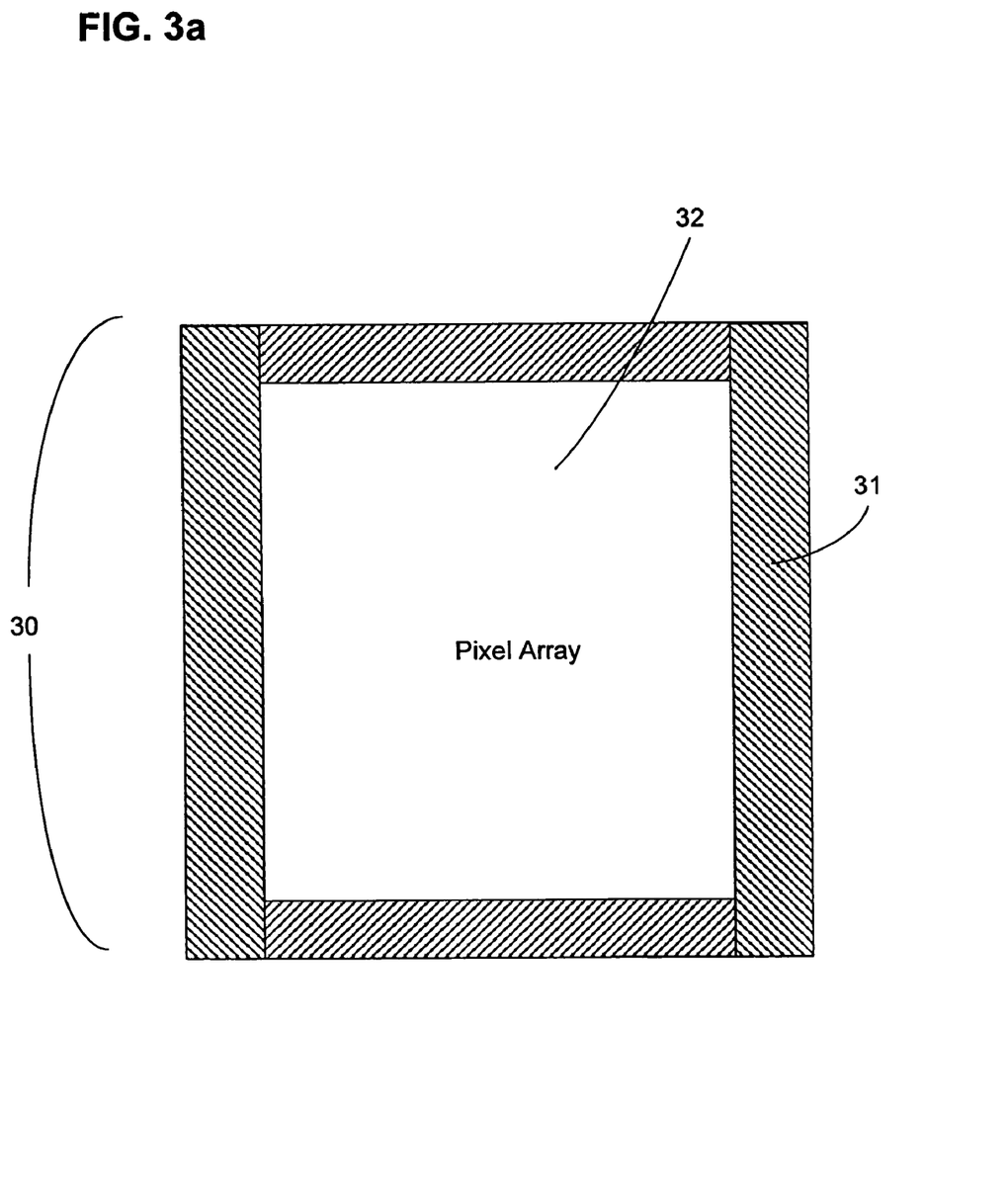
FIG. 3a shows a simplified imager pixel array with dark pixel structures.

FIG. 3a shows peripheral areas 31 of a pixel array 30 which contains dark pixels from which dark current measurements are taken. The dark pixels in peripheral areas 31 are read-out using the same signal path and timing diagram as for clear pixels in area 32 which are used for imaging.

Figure 3B:
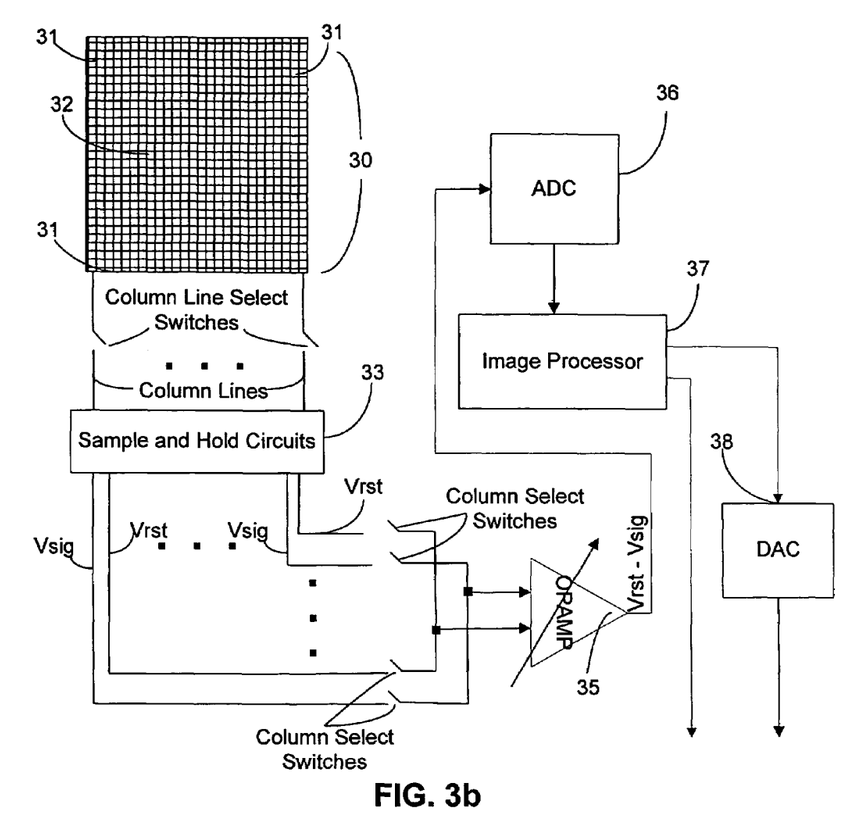
FIG. 3b shows an exemplary signal chain for an imager.

Referring to FIG. 3b, an exemplary signal path for read out of clear and dark pixels is shown. A pixel array 30 is coupled to column sample and hold circuits 33. The sample and hold circuits 33 sample pixel signals from array 30 row-by-row and column-by-column within a row as known in the art. In actual practice, each pixel whether clear or dark, provides two signals during operation, a reset signal Vrst and an image signal Vsig. These two signals are subtracted to yield an actual signal based on the pixel photo conductive process. For dark pixels, this value subtraction represents pixel dark current $I_{dark}$. As shown in FIG. 3b, the subtraction is performed in a differential amplifier 35 and the resultant signals are digitized in an analog to digital converter (ADC) 36. The digitized pixel signals are input into an image processor 37 which performs image processing on clear pixels signals and can also perform sensor temperature calculations based on the sampled dark pixel signals using the values of $\alpha$ and $I_0$ or $\alpha$, $T_{ref}$ and $I_{dark,ref}$. The image processor 37 has two outputs in this embodiment. One output path is to a digital to analog converter (DAC) 38 and another output path carries digital data output from the image processor, including temperature data.

Figure 3C:
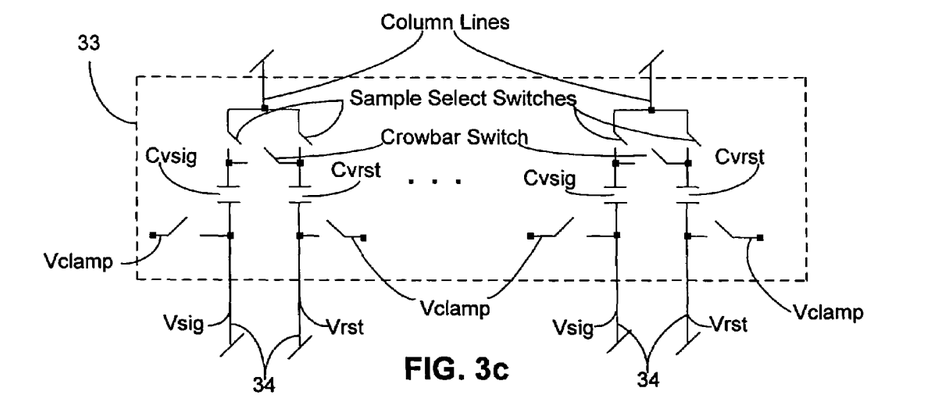
FIG. 3c shows an exemplary portion of the FIG. 3b signal chain.

FIG. 3c shows in greater detail the above mentioned sample and hold circuits 33 of FIG. 3b. In particular, FIG. 3c shows a set of sample and hold capacitors Cvrst, Cvsig selectively coupled to each column line which stores a Vrst and Vsig signals from a selected pixel. A clamping voltage Vclamp is switched to the backsides of capacitors Cvrst, Cvsig before the signals Vrst, Vsig are sampled onto the capacitor. After the signals Vrst and Vsig are sampled onto the capacitor, column and crowbar switches are used to apply the Vsig and Vrst signals sampled and stored on capacitors Cvrst, Cvsig into a differential amplifier 35.

While temperature T can be calculated from a single dark pixel of an array, an improvement in sensor temperature calculations accuracy can be obtained by calibrating the $I_{dark}$ signal through signal conditioning. It is well recognized that after amplification and digitization of the pixel signal, the converted $I_{dark}$ signal obtained from a dark pixel is composed of two components. A first component is related to the pixel current signal which, for a dark pixel, is proportional to the integrated dark current during the selected integration time. For a given integration time, this signal is temperature dependent and doubles about every 8° C. Another component is a systematic offset independent of the integration time. The offset component originates from signal conditioning procedures such as sampling, amplification and digitization and in general, is temperature dependent, although its exact dependence from temperature is not known in advance.

A large systematic offset may prevent the use of a sampled dark pixel signal $I_{dark}$ by itself to accurately determine array temperature, depending on the temperature accuracy which is required. Such an offset is removed by sampling two signals integrated by a dark pixel where each signal has different integration times, t1 and t2 to produce a calibrated dark current signal. A calibrated dark current $I_{dark}$ value with offset removed can be computed using equation 5 as follows:

$$I_{dark}=((S1+Voff)-(S2+Voff))/(t1-t2)=(S1-S2)/(t1-t2) \quad (5)$$

where S1 and S2 are the net pixel signals (Vrst−Vsig) from a dark current pixel taken for different respective integration times t1 and t2. $V_{off}$ is the offset component associated with each measurement. S1 and S2 are digitized output signals from an analog to digital converter (ADC), in this embodiment, which represent the digital value associated with uncalibrated net dark current sampling for integration times t1 and t2. A processor calculates $I_{dark}$ using S1, S2 and t1 and t2. In this way, the offset component ($V_{off}$) can be removed and a calibrated pixel dark current $I_{dark}$ value computed for use in a temperature calculation.

An automatic procedure for computing the calibrated dark current $I_{dark}$ using equation 5 can be implemented on-chip and produced as a result of computation made available at an output register of the imager. Calculation of calibrated $I_{dark}$ can be configured to be periodically executed by the imager or for instance as a part of those operations the imager routinely executes during an initialization phase. Once a dark current value $I_{dark}$ is obtained, then a sensor temperature can be computed in a processor or other logic circuit using the on-chip stored reference values using equation (2) or equation (4), as described above.

Figure 4:
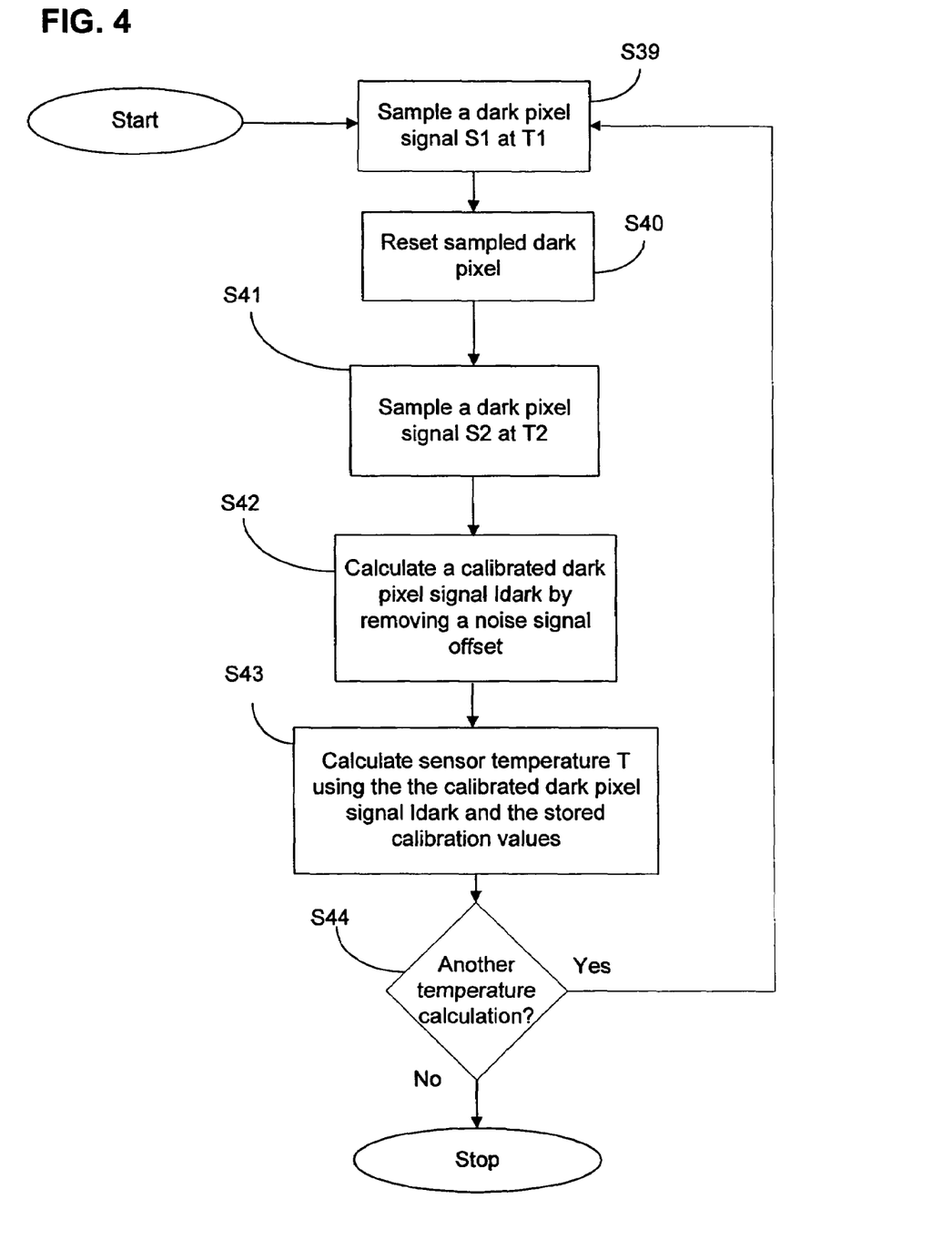
FIG. 4 shows an exemplary processing sequence for determining CMOS imager temperature.

Referring to FIG. 4, an exemplary method for performing a calculation of temperature from calibrated dark current and stored calibration values is shown. At processing segment S39, a net dark pixel signal S1 (Vrst$_1$−Vsig$_1$) is acquired using an integration time t1 from a dark pixel. The sampled dark pixel is then reset at processing segment S40. At processing segment S41, a net dark pixel signal S2 (Vrst$_2$−Vsig$_2$) is acquired for an integration time t2 from the dark pixel. One of the t1 or t2 time periods will be longer than the other time period to facilitate signal offset removal and produce a calibrated dark current signal $I_{dark}$ in accordance with equation 5. At processing segment S42, calibrated dark pixel signals $I_{dark}$ is calculated. Next, at processing segment S43, sensor temperature T is calculated in accordance with equation 2 if the values α and $I_0$ are stored or in accordance with equation 4 if the values α, $I_{dark\,ref}$ and $T_{ref}$ are stored. Next, a determination of whether or not another temperature calculation will be performed is made at processing segment S44. If yes, then processing recommences at processing segment S39. If no further temperature calculations are to be made, then processing stops. The temperature calculation can be repeated in order to obtain an average of temperature values for the same segment of the chip, or different reference dark current pixels from different segments of the chip can be averaged and used to produce a temperature measurement. It should be noted that it is not required that additional temperature calculations be performed as a single temperature value may be sufficient for a particular image processing need or requirement.

It should be noted that a highly precise temperature measurement may not be required in many applications. Moreover, it is often desirable to convert a larger bit digital value to a lower bit digital value in order to reduce processing or look-up table requirements. Thus, an estimated temperature with a desired precision can also be produced and used in accordance with the invention.

One temperature estimation technique which may be used is an estimation of variations in sensor working temperature from a reference temperature. Frequently, such an estimate will suffice for many applications. One way an estimate of a difference between actual temperature T1 and a reference temperature $T_{ref}$ can be produced is shown in equation 6:

$$T1-T_{ref}=1/\alpha * \ln(I_{dark}/I_{dark\,ref}) \quad (6)$$

Temperature estimation can also be accomplished using a temperature range corresponding to binary notation. A range scheme may be used to reduce the size of temperature values stored in an onboard register when a precise temperature value is not required.

Figure 5:
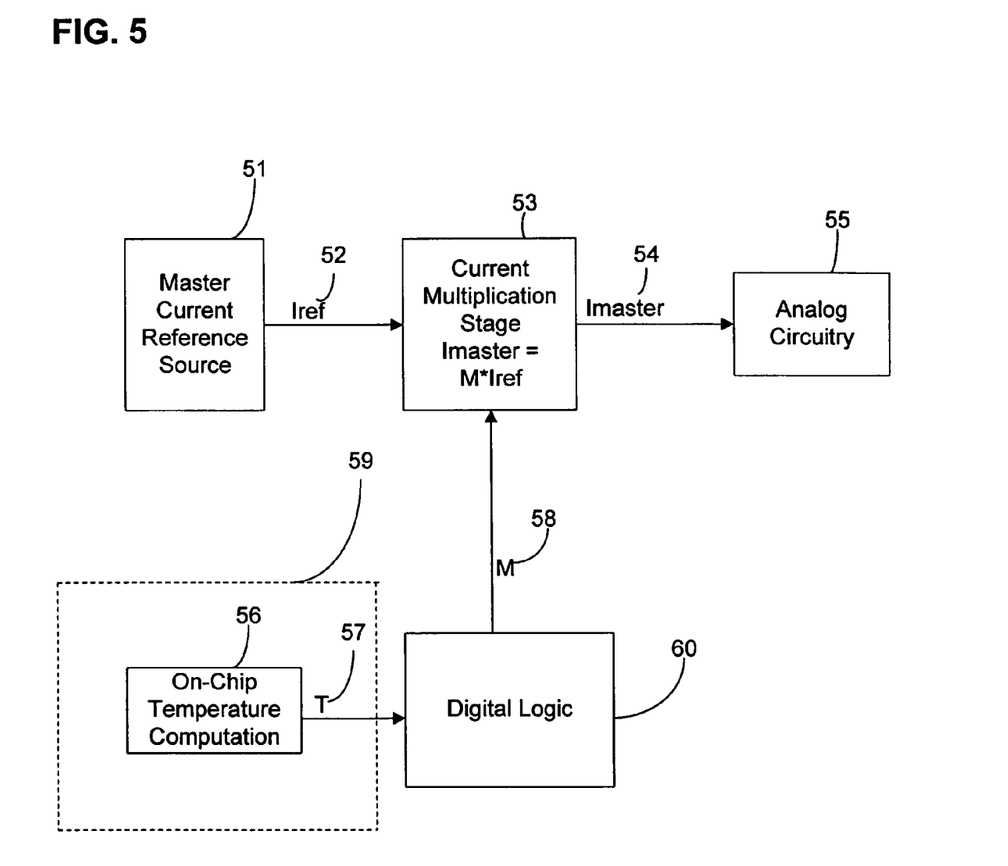
FIG. 5 shows an exemplary structure for determining an imager temperature.

Once a temperature value representing chip temperature is known, it can be used to compensate for temperature induced operational variations in an imager device. FIG. 5 shows a system for controlling the master current to an imager chip to compensate the master current for temperature variations. A chip temperature value calculated in accordance with the invention can be used to control current flow within an imager chip. A programmable current multiplication stage 53 is placed in between a master current reference source 51 and downstream analog circuitry 55 which requires current from source 51. The current multiplication stage 53 is controlled by an on-chip digital logic unit 60 which generates a scaling factor M 58 in response to a temperature data input 57. At low sensor ambient temperature, where the current reference $I_{ref}$ will be reduced with respect to its room temperature value, the multiplication constant M will be larger than unity. At high sensor ambient temperature, where the current reference will have a higher $I_{ref}$, the multiplication constant M will be less than unity. The current multiplication stage 53 generates an output current $I_{master}$ 54 by multiplication of the input $I_{ref}$ reference current with a scaling constant M 58. The actual value of scalar M 58 depends on temperature data T 57 which is provided by the calculated temperature value produced in control logic 59 using one of the temperature determining techniques described above. Note that a similar scheme could be applied for a master current reference cell with a negative thermal coefficient (NPTA) proportional to the sensor's absolute temperature provided that the multiplication constant M is decreased as the temperature increases. In other words, scaling factor M decreases if master current increases with temperature in a NPTA scheme. On the other hand, scaling factor M will increase if master current decreases. Scaling factor M may be stored in a look-up table as a function of a determined temperature value T.

Temperature compensation of the bias current can also be accomplished based on temperature measurements taken at various locations of a chip. Referring to FIG. 3b, different regions of the CMOS sensor chip are at different operating temperatures, as the power continuously dissipated on chip from the several blocks of analog electronics (analog to digital converter (ADC) 36, read-out amplifier 35, digital to analog converters (DAC) 38) is different. For example, those areas of the chip closest to the ADC analog circuitry 36 will be warmer than the read-out amplifier 35 region as the ADC 36 power dissipation is generally higher than the power dissipation of amplifier 35.

Figure 6:
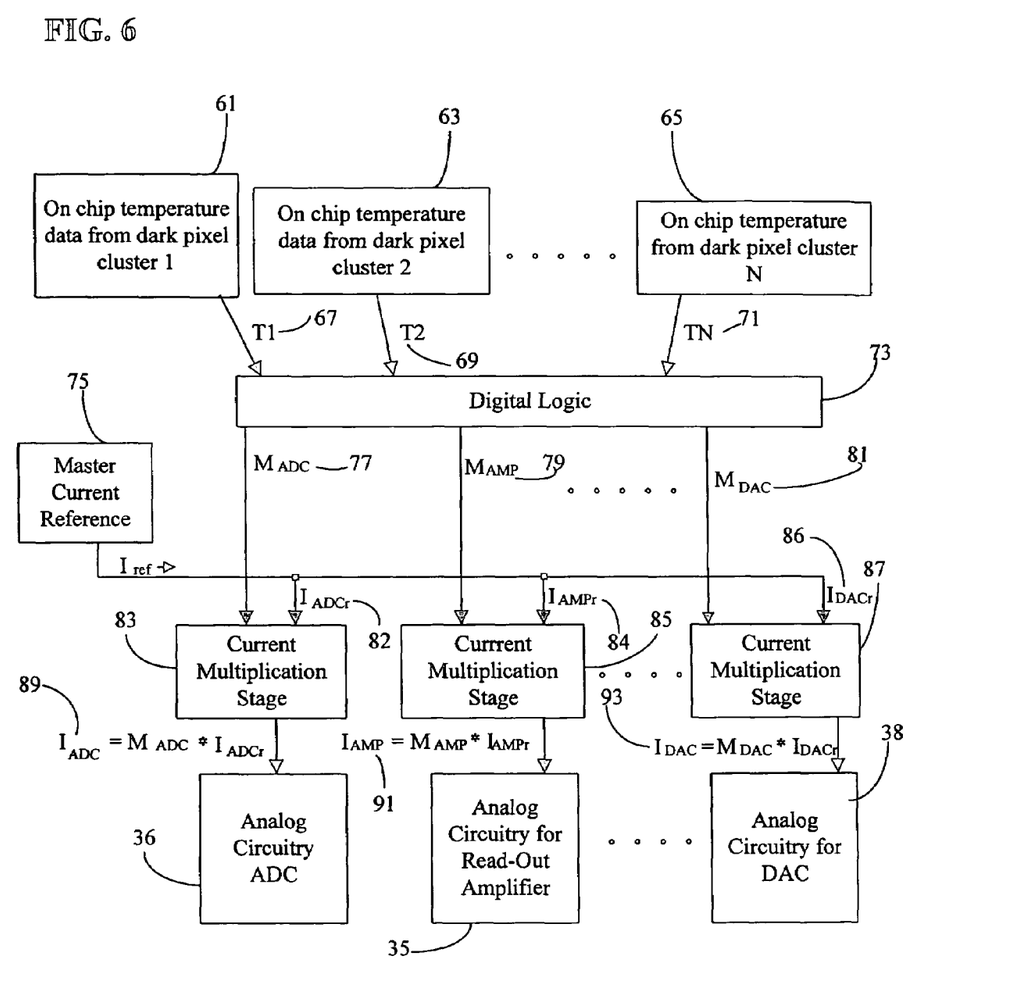
FIG. 6 shows a simplified exemplary structure for tuning a master current reference of an imager circuit.

A local correction of a bias current on a region-by-region basis can be employed by itself of or in addition to the master, current control illustrated and described with reference to FIG. 5. Such a local correction will depend on the specific location of a particular block of analog electronics (ADC, read-out amplifier, or DAC) on a chip in relation to a pixel array as block temperatures will be different at different component locations on a chip. The local correction approach requires the addition of a set of current multiplication stages as shown in FIG. 6, each controlled from the digital logic unit by a specific scaling or control signal related to the temperature measurements performed by the closest dark pixel used for temperature determination. Generally, each current multiplication stage will generate a unique current reference by multiplying a reference current $I_{ADCr}$, $I_{AMPr}$, $I_{DACr}$ by a different constant M (e.g., $M_{ADC}$, $M_{AMP}$ or $M_{DAC}$) to generate a bias current I (e.g., $I_{ADC}$, $I_{AMP}$ or $I_{DAC}$), each adjusted to compensated for a different determined temperature. While these circuits, which are current consumers, have been illustrated in FIG. 6, these are only exemplary and fewer or greater numbers of current consuming circuits may be used with the invention.

Referring to FIG. 6, one embodiment of the invention can include one or more dark pixels in the vicinity of one or more components on an imager chip to calculate a local temperature for one or more components or areas on an imager chip. Thus, local temperature calculations using a localized dark current pixel for each circuit component may be used with equations (2) or (4) to produce a localized temperature compensated scaled current, e.g. $I_{ADC}$, $I_{AMP}$, $I_{DAC}$.

In addition, clusters of dark pixels in proximity to imager components can also be used to supply dark pixel signal for use in temperature calculations. The pixel clusters at each localized area can be used in connection with equation (5) to obtain the effect noted above. Also, the temperature calculations for individual or pairs of pixels in a duster can be averaged to provide a more accurate temperature calculation. Whichever technique is used, on-chip dark current data $I_{dark}$ is processed and converted into temperature data T1 67, T2 69 and TN 71 from various dark clusters of pixels at different areas of the sensor chip (i.e., 61, 63 and 65). In this exemplary embodiment, cluster one is in the vicinity of an ADC 38, cluster two is in the vicinity of a read-out amplifier 35 and cluster N is in the vicinity of an N component, a DAC 38 in this case. The temperature data (e.g., 67, 69, 71) is input into a digital logic unit 73 which determines scaling control signals $M_{ADC}$ 77, $M_{AMP}$ 79 and $M_{DAC}$ 81.

Scaling control signals (M) can determined using one or more look-up tables which store M values that correspond to a particular calculated temperature (e.g., T2, T2 or T2) value or a range of calculated temperature values. For example, in this embodiment control signal $M_{ADC}$ 77 is determined by looking up the M value in a look-up table which corresponds to the calculated T1 value.

The look-up tables can be used to store scaling signal M values which correspond to ranges of calculated temperature values. Look-up tables which associate calculated temperature ranges with scaling signal M values can be used to reduce the number of look up table entries used to determine scaling value M for a particular calculated temperature, e.g., T1, T2 or T3.

Scaling signal $M_{ADC}$ 77 is input into a current multiplication stage 83 along with current reference $I_{ADCr}$ 82. Scaling signal $M_{AMP}$ 79 is input into a current multiplication stage 85 along with current reference $I_{AMPr}$ 85. Scaling signal $M_{DAC}$ 81 is input into another multiplication stage 87 along with current reference $I_{ref}$ 85.

Scaling signals $M_{ADC}$ 77, $M_{AMP}$ 79 and $M_{DAC}$ 81 are used in multiplication stages 83, 85, 87 to adjust the respective input reference currents $I_{ADCr}$ 82, $I_{AMPr}$ 84 and $I_{DACr}$ 86 such that the reference currents are increased or decreased in a manner indicated by the scaling signals. Current signals $I_{ADC}$ 89, $I_{AMP}$ 91, $I_{DAC}$ 93 from multiplication stages 83, 85, 87 are respectively provided to ADC 36, amplifier 35, DAC 38.

A variety of current control circuit mechanisms are possible. As noted, one embodiment of the invention can also include a master control circuit which adjusts master current based on temperature in the manner described and illustrated with respect to FIG. 5 as well as another embodiment which supplies individual currents which are adjusted based on temperature in the manner described and illustrated with respect to FIG. 6. Another embodiment can provide for a combination of the master current adjustment system of FIG. 5 and an individual current adjustment system of FIG. 6 based on various temperature calculations. Also, temperature calculations can be accomplished using a programmable processor as well as hard wired logic circuits. Calculation of temperature can be provided within the image processor or another control circuit for an imager or in a separate current control circuit for the imager.

It should be noted that any temperature dependant signal or property in an imager can be corrected using the temperature sensor system described above. For example, voltage signals or circuit impedance can be corrected using the temperature values determined using the above described system use well known voltage, impedance or other circuit correction circuits.

Figure 7A:
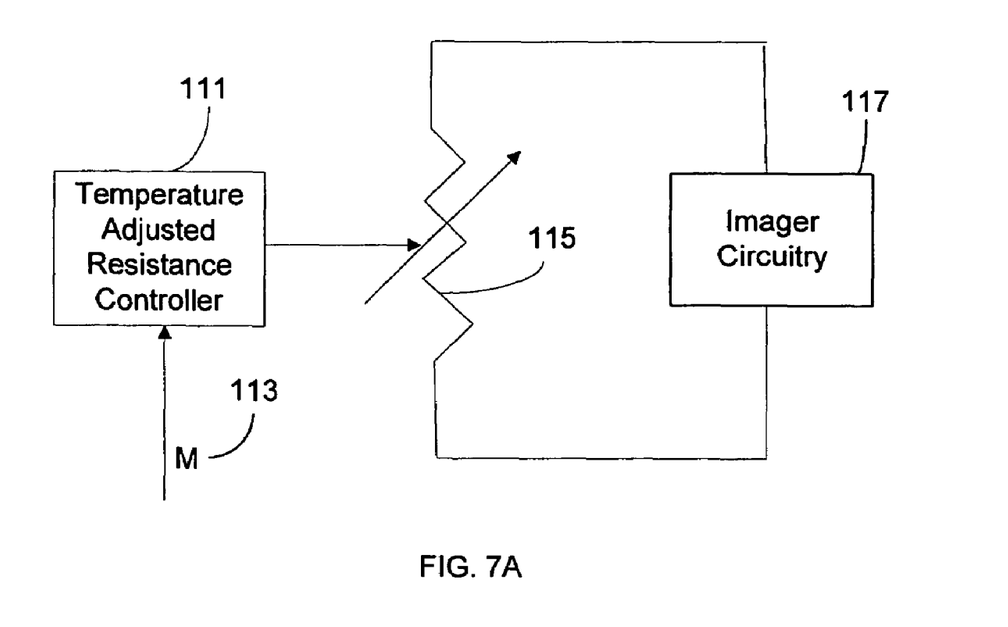
FIG. 7A shows a simplified exemplary structure for adjusting resistance of an imager circuit.

Referring to FIG. 7A, an exemplary embodiment of a circuit for adjusting resistance in one or more portions of an imager is shown. A chip temperature value calculated in accordance with the above described approaches then can be used to control resistance within an imager chip. A programmable resistance adjustment controller 111 connected to a variable resistor 115 which adjusts resistance values in imager circuitry 117. The controller 111 is controlled by an on-chip digital logic unit (not shown) which generates a scaling factor M 113 in response to a temperature data input. The actual value of scalar M 113 depends on temperature data which is provided by the calculated temperature value produced in the control logic unit using one of the temperature determining techniques described above.

Figure 7B:
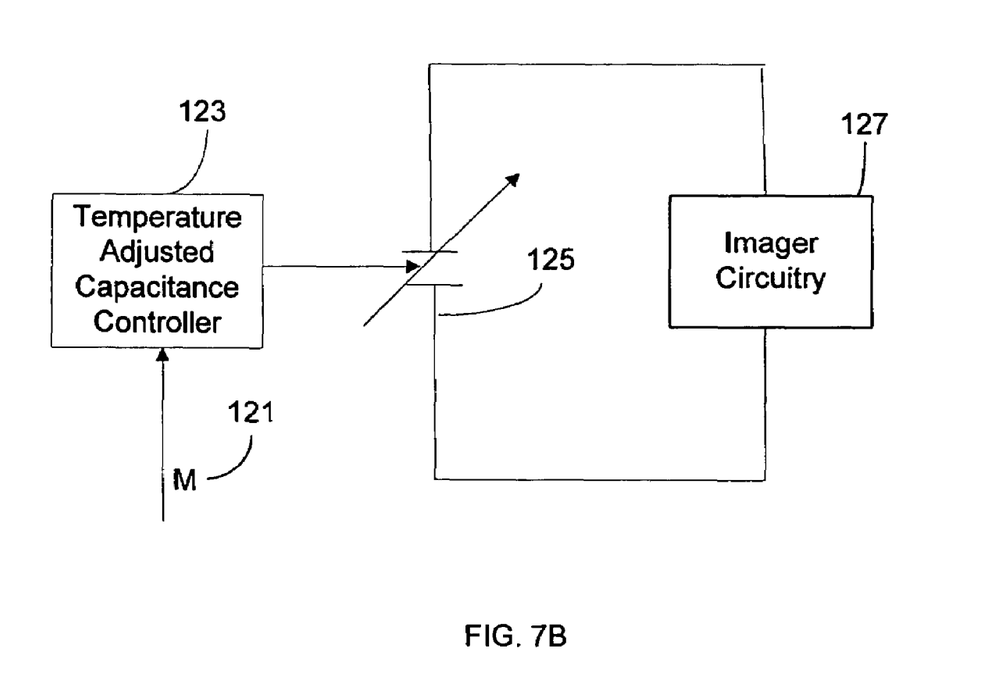
FIG. 7B shows a simplified exemplary structure for adjusting capacitance of an imager circuit.

Referring to FIG. 7B, an exemplary embodiment of a circuit for adjusting capacitance in one or more portions of an imager is shown. A programmable temperature adjusted capacitance controller 123 is connected to a variable capacitor 125 which adjusts capacitance in imager circuitry 127. The controller 123 is controlled by an on-chip digital logic unit (not shown) which generates a scaling factor M 121 in response to a temperature data input. The actual value of scalar M 121 depends on temperature data which is provided by the calculated temperature value produced in the control logic unit using one of the temperature determining techniques described above.

Figure 7C:
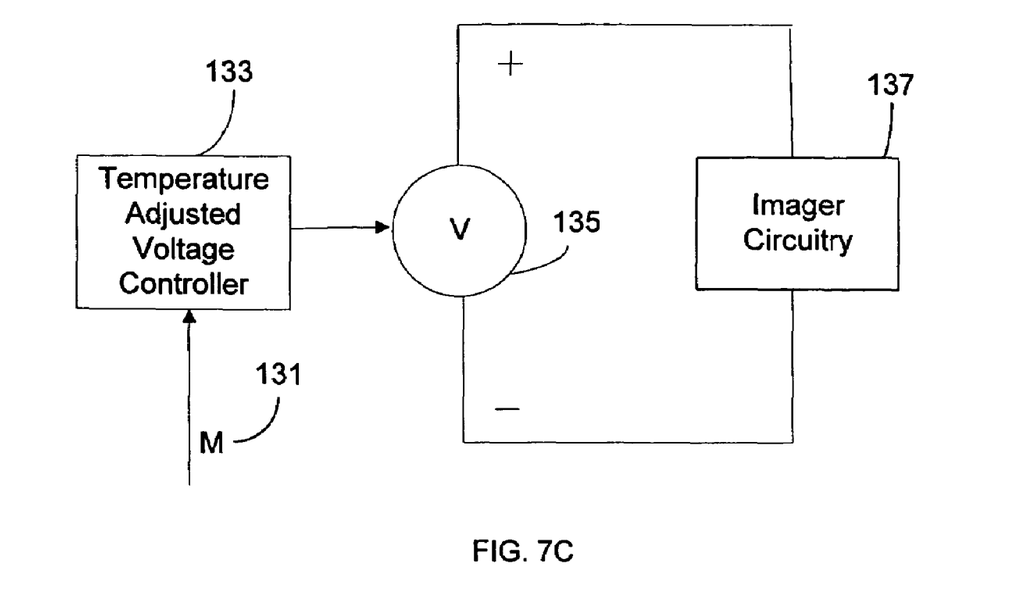
FIG. 7C shows a simplified exemplary structure for adjusting voltage of an imager circuit.

Referring to FIG. 7C, an exemplary embodiment of a circuit for adjusting voltage in one or more portions of an imager is shown. A programmable temperature adjusted voltage controller unit 133 is connected to a variable voltage source 135 which adjusts voltage in imager circuitry 137. The controller 133 is controlled by an on-chip digital logic unit (not shown) which generates a scaling factor M 131 in response to a temperature data input. The actual value of scalar M 131 depends on temperature data which is provided by the calculated temperature value produced in the control logic unit using one of the temperature determining techniques described above.

Figure 7D:
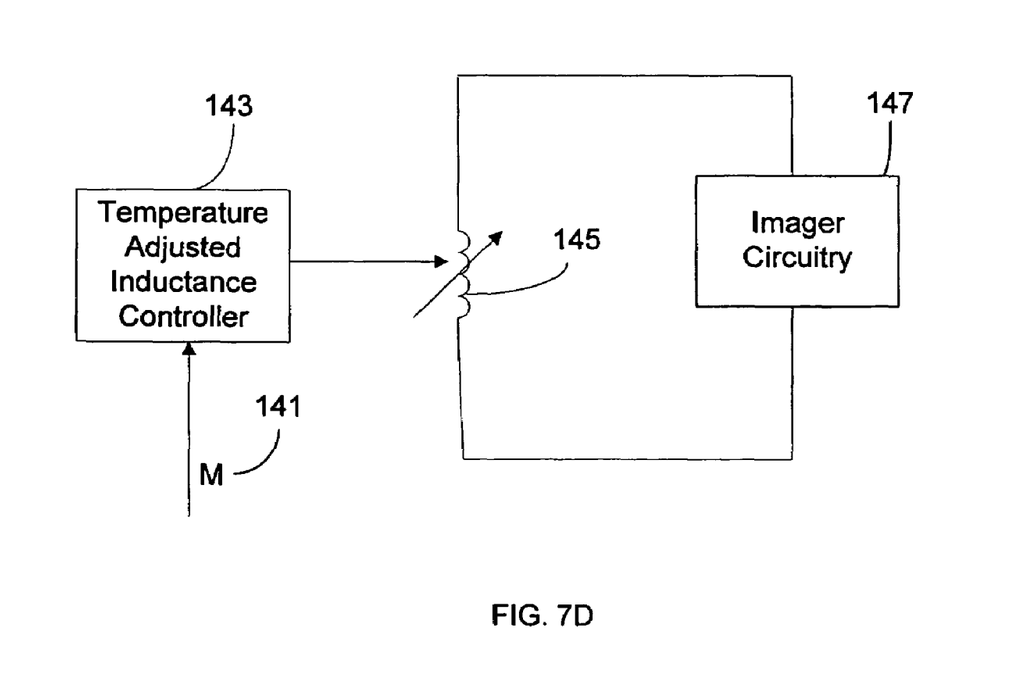
FIG. 7D shows a simplified exemplary structure for adjusting inductance of an imager circuit.

Referring to FIG. 7D, an exemplary embodiment of a circuit for adjusting inductance in one or more portions of an imager is shown. A programmable temperature adjusted inductance controller unit 143 is connected to a variable inductor 145 which adjusts inductance in imager circuitry 147. The controller 143 is controlled by an on-chip digital logic unit (not shown) which generates a scaling factor M 141 in response to a temperature data input. The actual value of scalar M 141 depends on temperature data which is provided by the calculated temperature value produced in the control logic unit using one of the temperature determining techniques described above.

It should be noted with reference to FIGS. 7A-7D that controllers 111, 123, 133, or 143 can be combined with an on-chip logic unit which performs temperature calculations. Also, one or more of circuits as in FIGS. 7A-7D can be incorporated into an imager chip in order to adjust one or more temperature dependent electrical properties such as voltage, inductance, resistance or capacitance.

While exemplary embodiments of the invention have been described and illustrated, it should be apparent that many changes and modifications can be made without departing from the spirit or scope of the invention. Accordingly, the invention is not limited by the description above, but is only limited by the scope of the appended claims.

What is claimed as new and desired to be protected by Letters Patent of the United States is:

1. A method of determining temperature of an imager chip, said method comprising:
    storing a fabrication process dependent value for an imager chip;
    storing at least one chip dependent value representing a measured pixel dark current reference value and a reference temperature at which said chip dependent dark current reference value was measured;
    measuring a dark current value of a pixel on said chip; and
    determining a chip temperature representation based on said measured dark current value and stored values.

2. A method of claim 1 further comprising storing said fabrication process dependent value and said chip dependent value on said chip.

3. A method of determining temperature of an imager device, said method comprising:
    acquiring at least one dark current signal from at least one pixel in a pixel array; and
    determining a temperature value using said acquired dark current signal together with a fabrication process value, and at least one other value representing a reference dark current signal of a pixel of said pixel array taken at a reference temperature.

4. A method as in claim 3 wherein said at least one other value is an imager chip dependent value.

5. A method as in claim 3 further comprising storing said dark current signal and said reference temperature at said imager device.

6. A method as in claim 3 wherein said chip dependent value is stored at said imager device.

7. A method of claim 3 further comprising correcting at least one temperature dependent parameter of said imager device using said temperature value.

8. A method of claim 7 wherein said parameter is a current.

9. A method of claim 7 wherein said parameter is a resistance.

10. A method of claim 7 wherein said parameter is a voltage.

11. A method of claim 8 wherein said parameter is an impedance.

12. A method of claim 7 wherein said parameter is a capacitance.

13. A method of determining temperature of an imager chip, said method comprising:
    storing a fabrication process dependent value for an imager chip;
    acquiring at least one dark current signal at a plurality of locations of a pixel array; and
    determining an associated temperature value for each of said locations using a respective said at least one dark current signal and said fabrication process dependent value.

14. A method as in claim 13 further comprising respectively adjusting each of a plurality of temperature dependent parameters of said imager based on an associated said temperature value.

15. A method as in claim 14 wherein said parameters comprise a current.

16. A method as in claim 14 wherein said parameters comprise an impedance.

17. A method as in claim 14 wherein said parameters comprise a resistance.

18. A method as in claim 14 wherein said parameters comprise a voltage.

19. A method as in claim 14 wherein said parameters comprise a capacitance.

20. A method of determining an imager chip temperature comprising:
    sampling a dark pixel signal with a first integration time;
    sampling a second dark pixel signal with a second integration time;
    providing a calibrated dark pixel signal using said first and second sampled dark pixel signals; and
    calculating a chip temperature using the calibrated dark pixel signal and a fabrication process dependent value related to dark current and temperature, and a chip dependent value related to dark current and temperature.

21. A method as in claim 20 wherein said fabrication process dependent value is related to temperature dependent dark current behavior of a plurality of imager devices manufactured using the same manufacturing process.

22. A method of determining an imager chip temperature comprising:
    sampling a first and second dark pixel signals from each of a plurality of dark pixel clusters, each said cluster sampling comprising:
        sampling a first dark pixel signal with a first integration time; and
        sampling a second dark pixel signal with a second integration time;
    calculating a calibrated dark pixel signal for each dark pixel cluster using said first and second dark pixel signal of each cluster; and
    calculating a separate chip temperature for each said dark pixel cluster using a said calibrated dark pixel signal for each said cluster and a fabrication process dependent value related to dark current and temperature, and a chip dependent value.

* * * * *